United States Patent
Edo et al.

(10) Patent No.: US 6,930,584 B2
(45) Date of Patent: Aug. 16, 2005

(54) MICROMINIATURE POWER CONVERTER

(75) Inventors: Masaharu Edo, Kanagawa (JP); Zenchi Hayashi, Nagano (JP)

(73) Assignee: Fuji Electric Device Technology Co., Ltd. (JP)

(*) Notice: Subject to any disclaimer, the term of this patent is extended or adjusted under 35 U.S.C. 154(b) by 0 days.

(21) Appl. No.: 10/760,116

(22) Filed: Jan. 16, 2004

(65) Prior Publication Data

US 2004/0208032 A1 Oct. 21, 2004

(30) Foreign Application Priority Data

Jan. 16, 2003 (JP) .......................................... 2003-008714
Mar. 27, 2003 (JP) .......................................... 2003-086942

(51) Int. Cl.⁷ ................................................. H01F 5/00
(52) U.S. Cl. ...................... 336/200; 336/223; 336/232; 336/192; 336/198; 333/181; 333/184
(58) Field of Search ................................. 336/200, 232, 336/223, 192, 198, 208; 333/181, 184, 185; 323/282, 285, 290, 294, 249

(56) References Cited

U.S. PATENT DOCUMENTS

| 5,583,424 A | * 12/1996 | Sato et al. .................... 323/282 |
| 5,694,030 A | * 12/1997 | Sato et al. .................... 323/282 |
| 6,144,269 A | * 11/2000 | Okamoto et al. ............ 333/184 |
| 6,317,965 B1 | * 11/2001 | Okamoto et al. ........... 29/602.1 |

FOREIGN PATENT DOCUMENTS

| JP | 2000-216200 A | 8/2000 |
| JP | 2001-196542 A | 7/2001 |
| JP | 2002-233140 A | 8/2002 |

* cited by examiner

Primary Examiner—Lincoln Donovan
Assistant Examiner—Jennifer A. Poker
(74) Attorney, Agent, or Firm—Rossi, Kimms & McDowell

(57) ABSTRACT

A microminiature power converter includes a semiconductor substrate on which a semiconductor integrated circuit is formed, a thin film magnetic induction element, and a capacitor. The thin film magnetic induction element includes a magnetic insulating substrate, and a solenoid coil conductor in which a first conductor is formed on a first principal plane of the magnetic insulating substrate, a second conductor is formed on a second principal plane of the magnetic insulating substrate, and a connection conductor is formed in a through hole passing through the magnetic insulating substrate are connected. A relationship of a length L of the magnetic insulating substrate in a direction vertical to a magnetic field generated by the solenoid coil and a length d of the coil conductor is $d \geq L/2$.

14 Claims, 7 Drawing Sheets

MICROMINIATURE POWER CONVERTER

DETAILED DESCRIPTION OF THE INVENTION

The present invention relates to a microminiature power converter, such as a DC-DC converter, constituted by a semiconductor integrated circuit (hereinafter referred to as an IC) formed on a semiconductor substrate and a passive component such as a coil, a capacitor and a resistor.

In recent years, electronic information equipment, especially various portable types of electronic information equipment, have become remarkably widespread. Most types of the electronic information equipment have batteries as power sources and include built-in power converters such as DC-DC converters. In general, the power converter is constructed as a hybrid module in which individual parts of active components, such as switching elements, rectifiers and control ICs, and passive elements, such as coils, transformers, capacitors and resistors, are located on a ceramic board or a printed board of plastic or similar material.

FIG. 13, for example, is a circuit structural view of a DC-DC converter. A dotted line portion 50 of an outer frame in the drawing is a circuit of the DC-DC converter. The DC-DC converter is constituted by an input capacitor Ci, an output capacitor Co, an adjusting resistor RT, a capacitor CT, a thin film inductor Lo, and an IC for a power source. A DC input voltage Vi is provided as an input, a MOSFET of the IC for the power source (the drawing simply shows the power IC) is switched, and a predetermined DC output voltage Vo is output. The thin film inductor Lo and the output capacitor Co form a filter circuit for outputting the DC voltage. In this circuit, when the DC resistance of the inductor Lo reduced in thickness becomes large, a voltage drop in this portion becomes large, and the output voltage Vo becomes low. That is, the conversion efficiency of the DC-DC converter becomes low.

With a request for miniaturization and reduction in weight of the various types of electronic information equipment including portable ones, a request for miniaturization of the built-in power converter is also high. The miniaturization of the hybrid power module has been developed by an MCM (Multi Chip Module) technique, a technique of laminated ceramic parts or the like. However, since individual parts are arranged and mounted on the same substrate, the reduction in mounting area of the power module is restricted. Especially, a magnetic induction part such as an inductor or a transformer has a very large volume as compared with an integrated circuit, it is the most serious restriction in the miniaturization of the electronic equipment.

As future possible courses concerning the miniaturization of the magnetic induction part, two courses are conceivable, that is, a course in which it is made a chip part and is made as small as possible, and the whole power source is made small by surface mounting, and a course in which it is formed on a silicon substrate by using a thin film. In recent years, in response to the request for the miniaturization of the magnetic induction part, there is reported an example in which a thin micro-magnetic element (coil, transformer) is mounted on a semiconductor substrate by application of a semiconductor technique. In addition, the present inventor also devised such a planar thin film magnetic induction component (See JP-A-2001-196542). This is such that a planar thin film magnetic induction element (thin film inductor) in which a thin film coil is sandwiched between a magnetic thin film and a ferrite thin plate is formed by a thin film technique on a surface of a semiconductor substrate in which a semiconductor device such as a switching element or a control circuit is formed. By this, it becomes possible to reduce the thickness of the magnetic induction element and to reduce the mounting area thereof. However, there were still problems that the number of individual chip parts is large, and the mounting area is large.

In order to solve this, the present inventor devised a microminiature power converter already disclosed (See JP-A-2002-233140). A planar thin film magnetic induction element used for this microminiature power converter is formed such that a resin mixed with magnetic fine particles is filled in a gap of a spiral (mosquito-repellent coil shape) coil conductor, and an upper surface and a lower surface are put between ferrite thin plates of magnetic insulating substrates. However, in this method, since the inductance of the coil conductor is substantially in proportion to the number of turns of the spiral, in order to secure a large inductance, it is necessary to increase the number of turns of the spiral. When the number of turns of the spiral is increased without increasing the mounting area, it is necessary to lessen the cross-sectional area of the coil conductor.

That is, in order to obtain a high inductance, the cross-sectional area of the coil conductor must be made small, and the length of the conductor line must be made long. However, when the cross-sectional area of the coil conductor is made small, and the length of the conductor line is made long, the DC resistance of the coil conductor is increased, the voltage drop in the coil conductor becomes large, and the conversion efficiency of the microminiature power converter is lowered. Besides, since the DC resistance is increased, power loss is also increased.

In view of the above, it would be desirable to provide an ultra-thin microminiature power converter including an inductor (thin film magnetic induction element) reduced in thickness, in which a mounting area is small, power conversion efficiency is improved, and power loss can be reduced.

SUMMARY OF THE INVENTION

The present invention provides a microminiature power converter including a semiconductor substrate on which a semiconductor integrated circuit is formed, a thin film magnetic induction element, and a capacitor, the thin film magnetic induction element includes a magnetic insulating substrate, and a solenoid coil conductor in which a first conductor formed on a first principal plane of the magnetic insulating substrate, a second conductor formed on a second principal plane of the magnetic insulating substrate, and a connection conductor formed in a through hole passing through the magnetic insulating substrate are connected, and in the thin film magnetic induction element, a relation of a length L of the magnetic insulating substrate in a direction vertical to a magnetic field generated by the solenoid coil and a length d of the coil conductor is $d \geq L/2$.

Further, the magnetic insulating substrate may be a ferrite substrate.

Further, a surface of the coil conductor may be covered with an insulating film or a resin in which magnetic fine particles are dispersed.

Still further, the first principal plane and the second principal plane of the magnetic insulating substrate of the thin film magnetic induction element are provided with electrodes electrically connected through a through hole.

In addition, the semiconductor substrate is electrically connected to the electrode formed on the magnetic insulating substrate of the thin film magnetic induction element.

The electrode electrically connected to the semiconductor substrate may also be disposed on an inside surface separate from an outer peripheral end of the magnetic insulating substrate.

Further, a surface of an outer peripheral part of the magnetic insulating substrate opposite to the semiconductor substrate may be covered with a direct contact protection film, wherein the protection film may be a resist protection film.

Still further, a part of the semiconductor substrate and the surface of the outer peripheral part of the magnetic insulating substrate opposite to the semiconductor substrate may be covered with a direct contact binder, wherein the binder may be an under filling.

BRIEF DESCRIPTION OF THE DRAWINGS

With the above as background, reference will be made to the following detailed description of the preferred embodiments of the invention and the accompanying drawings, wherein:

FIGS. 4(a)–4(h) illustrate a fabrication method of the inductor of FIG. 1(a), in which FIGS. 4(a) to 4(h) are main part process sectional views shown in process sequence;

DETAILED DESCRIPTION OF THE PREFERRED EMBODIMENTS

Figure 1A:
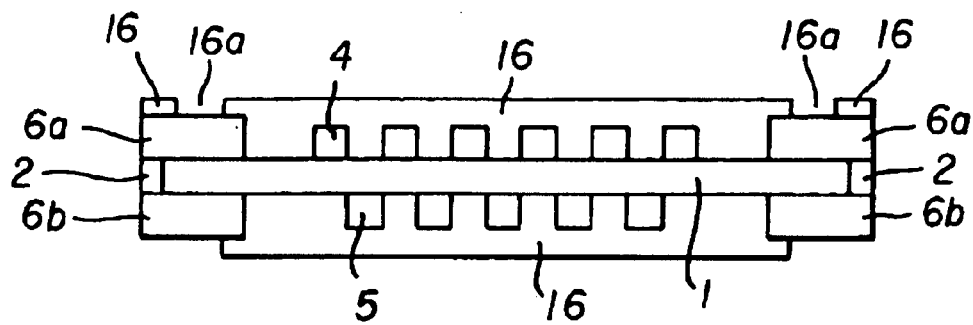
FIG. 1(a) is a sectional structural view of a microminiature power converter of a first embodiment of the invention.
Figure 1B:
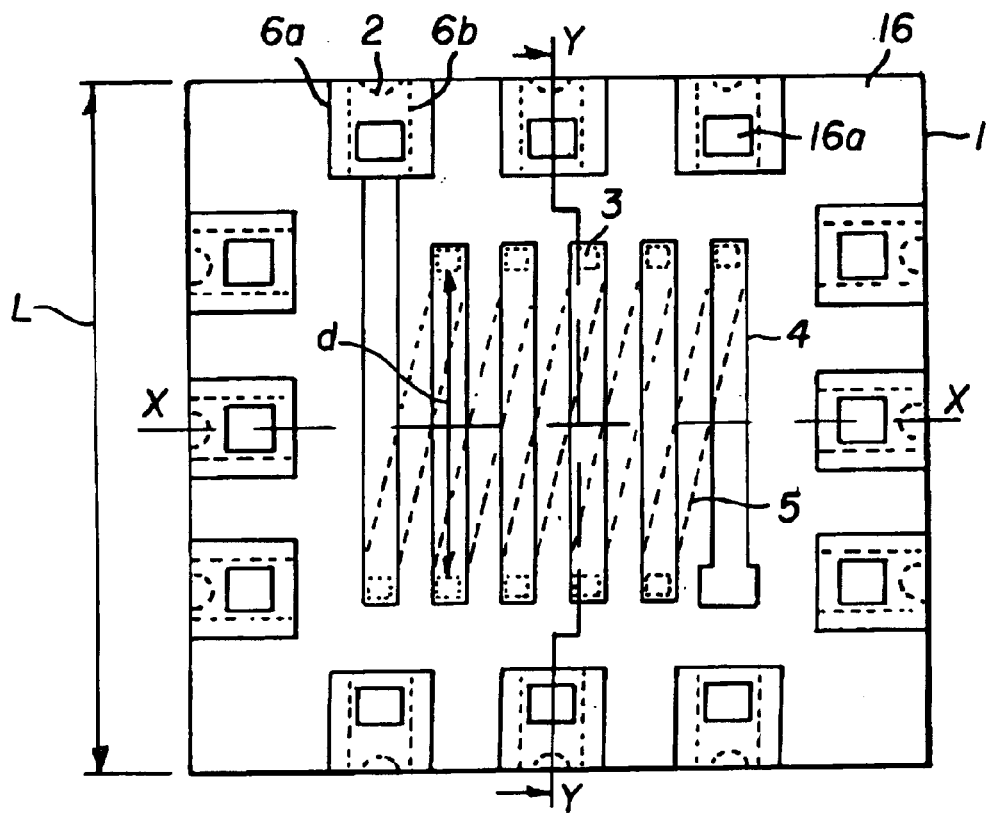
FIG. 1(b) is a plan view of the microminiature power converter illustrated in FIG. 1(a)
Figure 2:
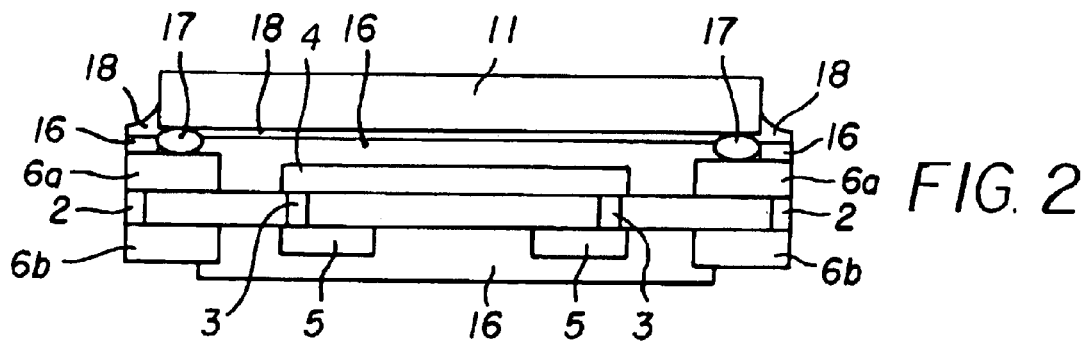
FIG. 2 is a main part sectional view of the microminiature power converter.

FIG. 1 and FIG. 2 are main part structural views of a microminiature power converter of a first embodiment of the invention, FIG. 1(a) is a main part sectional view of an inductor as a thin film magnetic induction element, FIG. 1(b) is a main part plan view seen through the above of FIG. 1(a), and FIG. 2 is a main part sectional view of the microminiature power converter. Further, FIG. 1(a) is the main part sectional view taken along line X—X of FIG. 1(b), and FIG. 2 is the main part sectional view of the microminiature power converter taken along a line corresponding to line Y—Y of FIG. 1(b). In these drawings, not only a coil pattern of the inductor, but also electrodes 6a and 6b (the electrodes function as external connection terminals for connection to an IC chip, a capacitor and the like) for electrical connection are shown at the same time. Further, FIG. 2 relates to the microminiature power converter completed after cutting along dotted lines of FIG. 4(h) described later, and is the main part sectional view taken along the line corresponding to the line Y—Y of FIG. 1(b).

As shown in FIG. 1(b), the plane shapes of the coil conductors 4 and 5 are linear, the coil conductor 4 is formed on a first principal plane of a magnetic insulating substrate 1 such as a ferrite substrate, the coil conductor 5 is formed on a second principal plane, the respective conductors 4 and 5 are electrically connected by connection conductors 3 formed in through holes, and are formed into a solenoid shape.

As shown in FIG. 2, an IC chip 11 (in which a power integrated circuit is formed) such as a power IC is disposed on a one surface side (upper side) of the magnetic insulating substrate 1, so that two main elements of the power converter, that is, the inductor and the power IC are formed to be microminiature. It should be noted that a capacitor constituting the microminiature power converter is omitted in the drawing. Although this capacitor may be externally provided, when a capacitor element such as a laminated ceramic capacitor array is disposed on the other side (lower) surface, the further miniaturized microminiature power converter can be obtained.

The IC chip 11 and the capacitor element are electrically connected through the electrodes 6a and 6b formed at the periphery of the magnetic insulating substrate 1. In the drawing, reference numeral 2 denotes a connection conductor formed in a through hole; 16, a protection film; 16a, an opening (which becomes a pad) of the protection film, for fixing bump; 17, a bump formed on the IC chip; and 18, an under filling. The connection conductor 2 electrically connects the side electrode 6a and the reverse side electrode 6b. In addition, the bump 17 is used for fixing the IC chip 11 and the electrode 6a, and the under filling 18 is filled in the gap between the IC chip 11 and the inductor and is used to further intensity the fixation of these.

Figure 3:
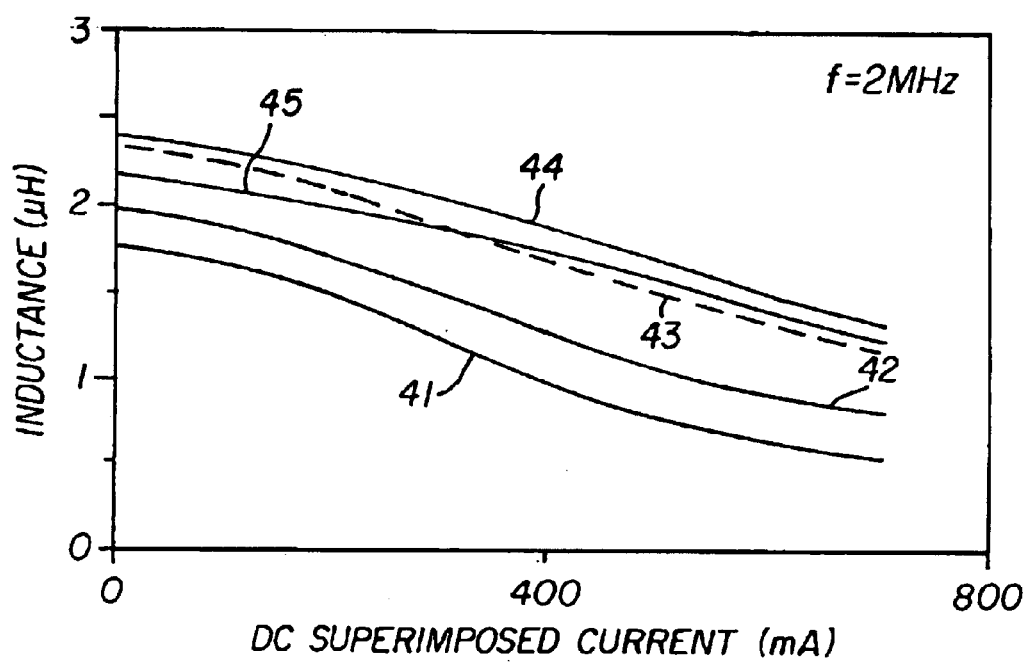
FIG. 3 illustrates a superposition characteristic of the inductor of FIG. 1(a).

In FIG. 1(b), when the length of the coil conductor is made d, and the length of the magnetic insulating substrate in the direction vertical to a direction (direction of line X-X) of a magnetic field generated in the coil is made L, as shown in FIG. 3, the distance between the facing connection conductors 3 is made $d \geq L/2$, the inductance of the inductor reduced in thickness is raised, and the DC superposition characteristic can be improved. As a result, it is possible to provide the ultra-thin microminiature power converter including the inductor (thin film magnetic induction element) reduced in thickness, in which the mounting area is small, the power conversion efficiency is improved, and the power loss can be reduced. Incidentally, d and L are in parallel.

FIG. 3 is a view for explaining the DC superposition characteristic of the inductor of FIG. 1. Data (parameters) of the inductor used for obtaining the DC superposition characteristic are such that the length L of the magnetic insulating substrate of the inductor is 3.5 mm, its thickness is 525 μm, the initial permeability of the magnetic insulating substrate is 100, and the number of turns of the coil is 11, and the coil conductors have five kinds of lengths d, that is, 1.3 mm (No 41), 1.5 mm (No 42), 1.75 mm (No 43 and L/2), 1.9 mm (No 44), and 2.1 mm (No 45).

A high frequency current applied to the inductor in order to obtain the inductance was 1 mA, its frequency was 2 MHz, and a DC superimposed current was made to fall within a range of 0 mA to 700 mA. Incidentally, L and d are lengths in the direction vertical to the magnetic field (horizontal direction: direction of the line X-X of FIG. 1) generated by the solenoid coil conductor, the length L of the magnetic insulating substrate is the distance between the facing ends, the length d of the coil conductor is the distance between the facing connection conductors 3 and is the maximum length (=maximum length of the section of the coil inside magnetic insulating substrate) of the coil section.

As shown in the drawing, the DC superposition characteristic of the inductor is improved at d=L/2=1.75 mm as a boundary. This is because in the case of d<L/2, the cross-sectional area (coil cross-sectional area) of a magnetic material at the inside of the coil conductor becomes small, and therefore, the inductance at the initial time (when the DC superimposed current is 0 mA) becomes small. Besides, since the cross-sectional area of the magnetic material at the inside of the coil conductor is small, the magnetic flux density of the magnetic material at the inside of the coil conductor becomes larger than the magnetic flux density of the magnetic material at the outside of the coil conductor, and the degree of magnetic saturation of the magnetic material at the inside of the coil conductor becomes large as the DC superimposed current increases. Thus, as the DC superimposed current is increased, the degree of lowering of the inductance becomes large. That is, the DC superposition characteristic deteriorates.

On the other hand, in the case of d>L/2, as compared with the case of d<L/2, since the cross-sectional area of the magnetic material at the inside of the coil conductor is large, the inductance at the initial time becomes large. Besides, the inductance at the initial time becomes large until d becomes a predetermined value, and when d exceeds the predetermined value, the inductance at the initial time is lowered. That is, the inductance has a peak at the predetermined value. This predetermined value of d is 1.9 mm from FIG. 3(b).

In the case of d>L/2, even if the DC superimposed current is increased, as compared with the case of d<L/2, the rate of lowering of the inductance becomes small, and the DC superposition characteristic is improved. Further, as d is increased, the rate of the lowering becomes small, and at the time of d=L, the rate of the lowering becomes almost zero, and even if the DC superimposed current is increased, the inductance is hardly lowered. The inductance at d=L is about 1.1 $\mu$H.

From this, by realizing d$\geq$L/2, the inductance at the initial time can be made large, and further, even if the DC superimposed current is increased, the lowering of the inductance can be made small.

In FIG. 3(b), the inductance at the initial time and at d=2.1 mm (No 45) becomes smaller than that at d=1.75 mm (No 43) of L/2, and this is because the cross-sectional area of the magnetic substrate at the outside of the coil conductor is decreased, so that the quantity of magnetic flux passing through the external magnetic substrate is decreased.

This inductor in which the large inductance can be obtained at d$\geq$L/2 is especially effective when the relation of coil length>magnetic substrate thickness is established, that is, when it has a low-profile structure. Besides, this does not depend on the permeability of the magnetic substrate, the saturation magnetic flux density and the like.

Further, as described before, by realizing d$\geq$L/2, the large inductance and the improvement in the DC superposition characteristic can be obtained, and the inductor having a small mounting area can be obtained. As a result, as described before, it is possible to fabricate the ultra-thin microminiature power converter including the inductor (thin film magnetic induction element) reduced in thickness, in which the mounting area is small, the power conversion efficiency is improved, and the power loss can be reduced.

FIG. 4 shows a fabrication method of the inductor of FIG. 1, and the figure (a) to the figure (h) are main part process sectional views shown in process sequence. These process sectional views are sectional views taken along the line corresponding to the line Y—Y of FIG. 1.

First, as the magnetic insulating substrate 1, a Ni—Zn ferrite substrate having a thickness of 525 $\mu$m was used. The thickness of the ferrite substrate is determined from the required inductance, coil current value, and the characteristic of the magnetic insulating substrate, and is not limited to the thickness of this embodiment. However, in the case where the magnetic insulating substrate is as extremely thin as about 100 $\mu$m or less, magnetic saturation is apt to occur, and in the case where it is as thick as about 1 mm or more, the thickness of the microminiature power converter itself becomes thick, and therefore, it is appropriate that the thickness is selected according to the use object. Incidentally, as the magnetic insulating substrate, it is not limited to the ferrite substrate, and any substrate may be used as long as it is an insulating magnetic substrate (magnetic insulating substrate). At this time, the ferrite substrate, a material which could be easily molded into a substrate shape, was used.

First, through holes 2a and 3a are formed in the ferrite substrate as the magnetic insulating substrate 1. The interval of the facing through holes 3a is the length d of the coil conductor and is determined to become half or more of the length L of the magnetic insulating substrate 1. The through hole 2a is for connecting the electrode 6a used for connection to the IC chip 11 and the electrode 6b used for connection to a not-shown laminated ceramic array (actually, the electrode 6a and the electrode 6b are connected by the connection conductor 2 formed in this through hole 2a), and the through hole 3a is for connecting the coil conductors 4 and 5 (actually, the coil conductor 4 and the coil conductor 5 are connected by the connection conductor 3 formed in the through hole 3a). As a machining method for forming the through holes 2a and 3a, any of laser machining, sand blast machining, discharge machining, ultrasonic machining, and mechanical machining can be applied, and is required to be determined according to the machining cost, machining size and the like. In this embodiment, since the minimum machining size width was as minute as 0.13 mm, and there were many machining places, the sand blast method was used (FIG. 4(a)).

Next, the connection conductors 2 and 3 of the through holes 2a and 3a, the coil conductors 4 and 5 of the first principal plane and the second principal plane, and the electrodes 6a and 6b are formed. The details will next be described. In order to impart conductivity to the whole surface of the magnetic insulating substrate 1, a film of Ti/Cu is formed by a sputtering method, and a plating seed layer 12 is formed. At this time, although the conductivity is imparted to the through holes 2a and 3a as well, if necessary, electroless plating or the like may be performed. Besides, in addition to the sputtering method, a vacuum evaporation method, a CVD (Chemical Vapor Deposition) method or the like may be used. It may be formed by electroless plating. However, a method is appropriate in which adhesiveness to the magnetic insulating substrate 1 can be sufficiently obtained. Incidentally, with respect to the conductive material, although Cu is used at this time, any material may be used as long as it exhibits the conductivity. Although Ti is used at this time as the adhesion layer for obtaining the adhesiveness, Cr, W, Nb, Ta or the like can be used. Besides, although Cu becomes the seed layer 12 in which plating is generated in an electrolysis plating process of a subsequent process, Ni, Au or the like can also be used for this. At this time, the Ti/Cu film was used in view of easiness of machining in a subsequent process (FIG. 4(b)).

Next, patterns 13 for formation of the coil conductors 4 and 5 to be formed on the first principal plane and the second principal plane, and the electrodes 6a and 6b are formed by using a photoresist. In this embodiment, these patterns are formed by using a negative film-type resist (FIG. 4(c)).

Next, a Cu layer is formed by electrolytic plating onto openings of the resist patterns. At this time, Cu is also plated into the through holes 2a and 3a, the connection conductors 2 and 3 are also formed at the same time, the coil conductors 4 and 5 of the first principal plane and the second principal plane are connected, and a solenoid coil pattern 14a is formed. Besides, an electrode pattern 15a is also formed at the same time (FIG. 4(d)).

Figure 4A:
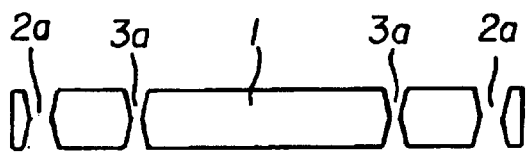
Figure 4B:
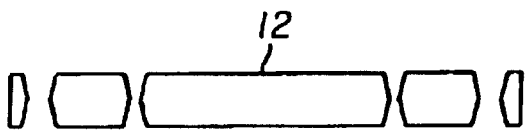
Figure 4C:
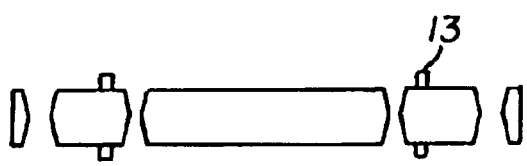
Figure 4D:
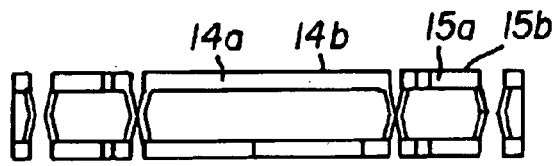
Figure 4E:
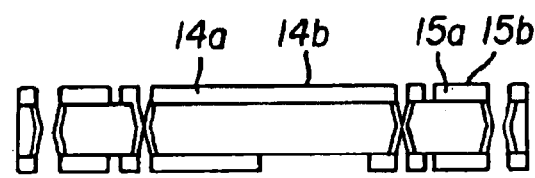
Figure 4F:
Figure 4G:
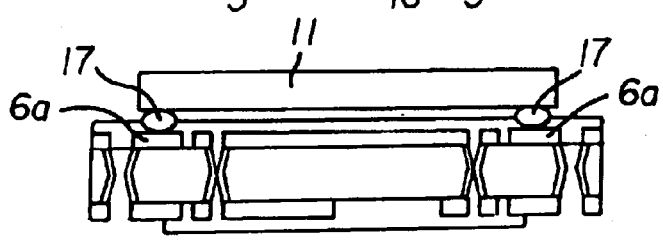

Next, after the electrolytic plating, the unnecessary photoresist and conductive layer are removed, so that specified coil conductors and electrodes are formed (FIG. 4(e)).

Next, an insulating film 16 is formed on the coil conductors 4 and 5. A film-type insulating film is used for this insulating film 16. The insulating film 16 functions as a protection film, and it is preferable to form the film to secure long reliability. Further, a formation method of this insulating film 16 is not limited to a film-type material, and a liquid-type insulating material may be pattern formed by screen printing and may be heat cured (FIG. 4(f)).

As the need arises, Ni or Au plating is performed to the surfaces of the coil conductors and the electrodes, and surface processing layers 14b and 15b are formed. In this example, in the process shown in FIG. 4(d), after the electrolytic plating of Cu was performed, Ni and Au were continuously formed by the electrolytic plating, however, these maybe formed by electroless plating after the completion of FIG. 4(e). Besides, after FIG. 4(f), the electroless plating may be carried out similarly. These metal protection conductors are for obtaining a stable connection state in a connection process of an IC in a subsequent process.

Next, the IC chip 11 as a power IC is connected to the electrode 6a formed on the inductor substrate. Its connection method is such that the bump 17 is formed on the electrode (pad) of the IC, and the IC chip 11 is connected to the electrode 6a of the inductor by ultrasonic connection (FIG. 4(g)).

Next, the fixation of the IC chip 11 and the inductor is reinforced by the under filling 18, and cutting is performed at dotted line places, so that the microminiature power converter is completed. As a connection method of the IC chip 11 and the inductor, here, the bump 17 and the ultrasonic connection were used, however, it is not limited to this, and soldering connection, conductive binding material or the like may be used. It is preferable to use a method in which connection resistance of the connection part becomes as small as possible. Although the under filling material was used to reinforce the fixation, a material may be selected as the need arises, and a sealing material such as an epoxy resin may be used. These are used to fix the respective elements and to obtain long reliability against disadvantage caused by the influence of moisture or the like, and they do not influence the initial characteristic itself of the power converter, however, it is preferable that they are formed in view of long reliability (FIG. 4(h)).

By the foregoing process, microminiaturization of the power converter in which parts (power IC and inductor) other than the capacitor are mounted can be realized. Further, by connecting the laminated ceramic capacitor array to the side opposite to the IC chip mounting surface of the inductor, the ultra-thin and microminiature power converter is formed.

Figure 4H:
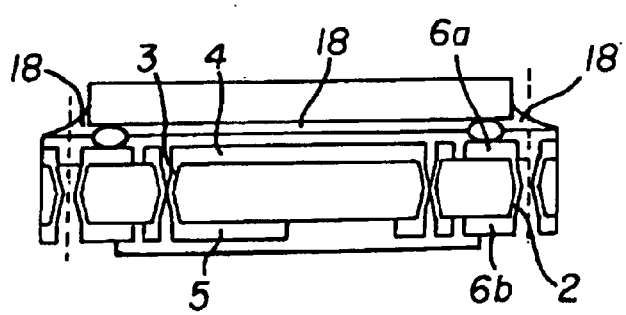

Incidentally, the shapes of the connection conductors 2 and 3 of FIG. 1(a) and FIG. 2 are schematically shown, and the shapes close to actual ones are as shown in FIG. 4(h).

Figure 5:
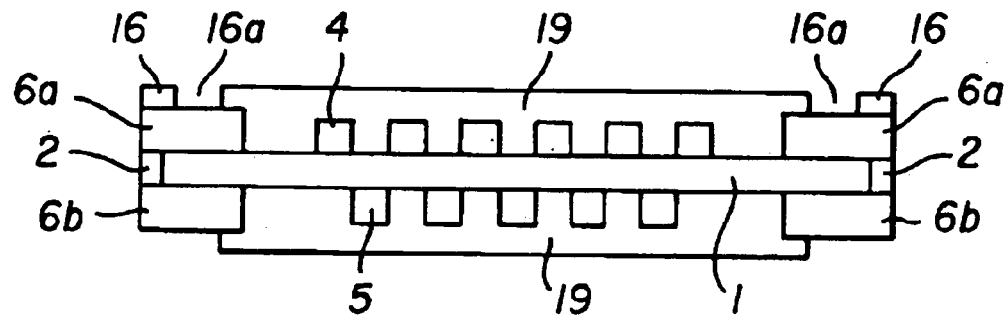
FIG. 5 is a main part sectional view of a microminiature power converter of a second embodiment of the invention.

FIG. 5 is a main part sectional view of a microminiature power converter of a second embodiment of the invention. This drawing corresponds to FIG. 2 and is the main part sectional view of only an inductor constituting the microminiature power converter.

A difference from FIG. 2 is that instead of the protection film 16 as the insulating film to cover the surface of the coil conductors 4 and 5 of FIG. 1, a resin 19 (hereinafter referred to as a magnetic resin) in which magnetic fine particles are dispersed is used. By this covering of magnetic resin 19, the high inductance and the improvement in the DC superposition characteristic can be realized.

This structure can be formed by applying the magnetic resin 19 as the insulating film finally formed as the protection film 16 on the coil conductor in the fabrication process of the inductor shown in FIG. 4.

Figure 6:
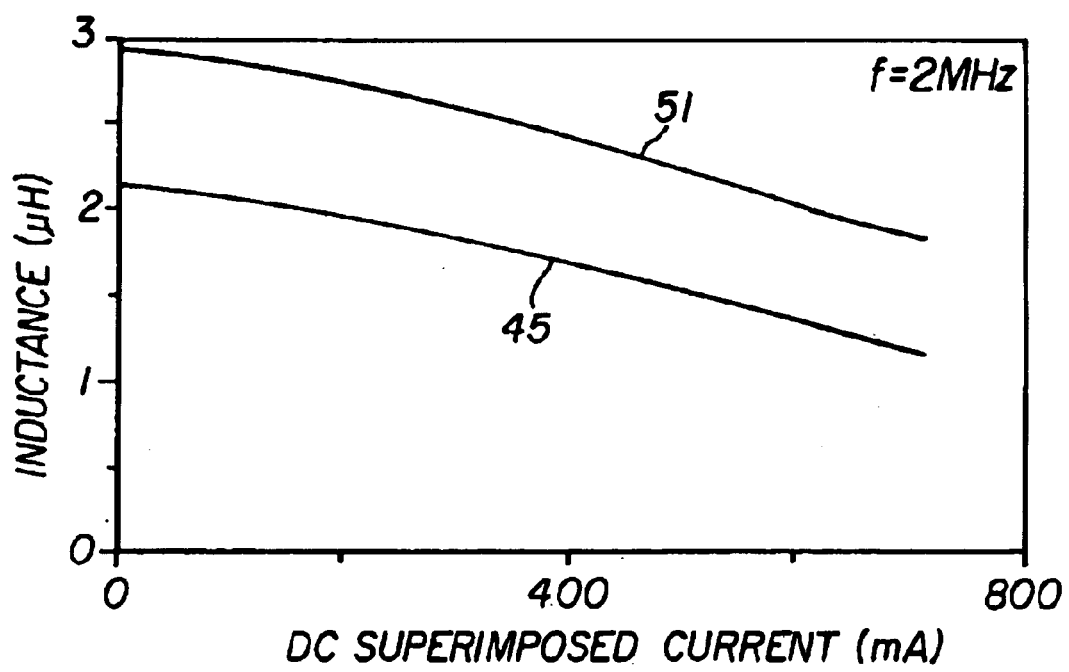
FIG. 6 illustrates a DC superposition characteristic of an inductor illustrated in the converter of FIG. 5.

FIG. 6 is a view showing the DC current superposition characteristic of the inductor of FIG. 5. Data of the coil are such that L=3.5 mm, d=2.1 mm, the thickness of the ferrite substrate is 525 $\mu$m, the number of turns of the coil is 11, the frequency is 2 MHz, and the initial permeability of the ferrite substrate is 100. Reference numeral 45 denotes the characteristic of the inductor when both sides of the coil conductors 4 and 5 are covered with the magnetic resin of 100 $\mu$m. The magnetic resin is used in which permalloy particles having an average particle size of 8 $\mu$m are dispersed in epoxy resin at a volume ratio of 50%. Besides, for comparison, reference numeral 51 shows the characteristic of a case where there is no magnetic resin. The data other than the existence of the magnetic resin are the same as those of the characteristic 45.

By covering the coil conductors 4 and 5 with the magnetic resin 19, the high inductance and the improvement in the DC superposition characteristic can be realized. Incidentally, in this embodiment, the permalloy particles were used as the magnetic fine particles, and the thickness was made 100 $\mu$m, the material of particles, volume ratio, thickness and the like are determined according to required characteristics.

As described above, by the covering of the magnetic resin 19, the inductance larger than that in the first embodiment can be obtained, and the mounting area of the inductor can be further reduced.

In the microminiature power converter of FIG. 2, the electrode 6a of the inductor is formed to reach the outer peripheral end of the magnetic insulating substrate 1, and the electrode 6a and the protection film 16 are in direct contact with each other and cover except for the opening 16a. In the case where the resist protection film is used as the protection film 16, since the adhesion force between the electrode 6a and the resist protection film is small, moisture penetrates from the interface (interface of the outer peripheral end of the magnetic insulating substrate 1) between the electrode 6a and the resist protection film, and in a solder reflow process as a subsequent process or an acceleration test of a heat cycle or the like, there is a case where a rupture occurs at the interface between the bump 17 and the electrode, and high reliability can not be always obtained. Next, embodiments to solve that will be described.

Figure 7A:
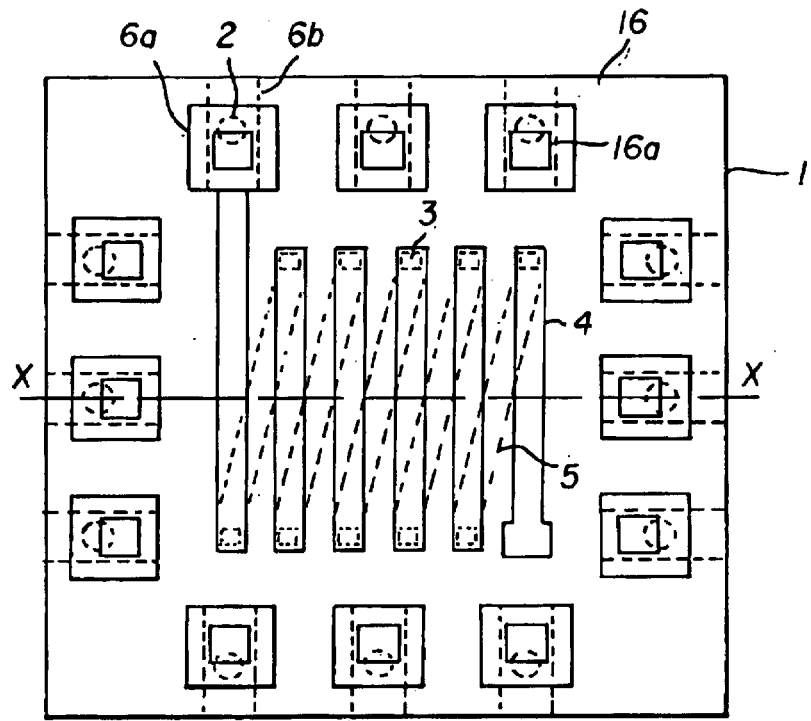
FIG. 7(a) illustrates a microminiature power converter of a third embodiment of the invention in plan view.

FIG. 7 shows an inductor used for a microminiature power converter of a third embodiment of the invention, the figure (a) corresponds to FIG. 1(b) and is a main part plan view, and the figure (b) corresponds to FIG. 1(a) and is a main part sectional view taken along line X-X of the figure (a).

A difference from FIG. 1 is that an electrode 6a formed on the surface of a magnetic insulating substrate 1 at the side where an IC chip is fixed does not reach the outer peripheral end of the magnetic insulating substrate 1 but is formed in the magnetic insulating substrate 1. In this embodiment, a protection film 16 is formed to be brought into direct contact with the surface of the peripheral part of the magnetic insulating substrate 1. By doing so, the electrode 6a having a low adhesion force and the resist protection film are not in direct contact with each other at the peripheral part, and as is explained in FIG. 10, in the case where the IC chip 11 is fixed, the effect is exhibited.

Figure 7B:
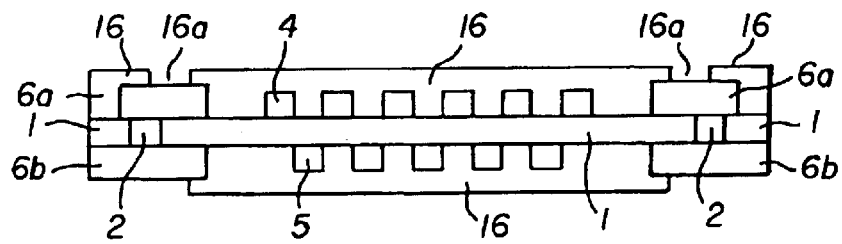
FIG. 7(b) is a main part sectional view taken along line X—X of FIG. 7(a).
Figure 8:
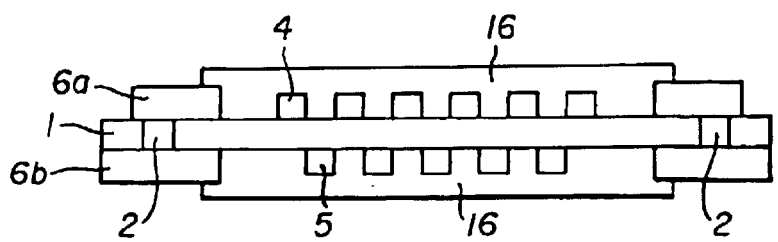
FIG. 8 illustrates an inductor used for a microminiature power converter of a fourth embodiment of the invention.

FIG. 8 shows an inductor used for a microminiature power converter of a fourth embodiment of the invention, and is a main part sectional view corresponding to FIG. 7(b). A difference from FIG. 7(b) is that the protection film 16 is not formed on the surface of the peripheral part of the magnetic insulating substrate 1 at the side where the IC chip is fixed, but an under filling 18 is formed by a subsequent process. As is explained in FIG. 11, in the case where the IC chip 11 is fixed, the effect is exhibited.

Figure 9:
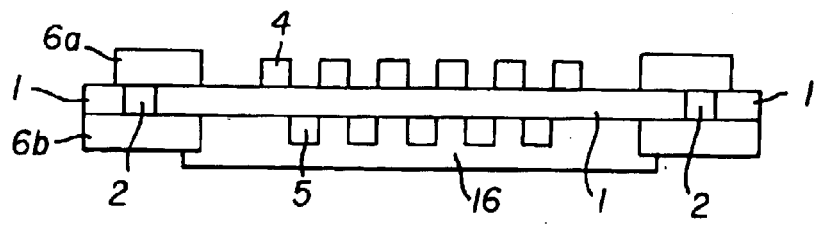
FIG. 9 illustrates an inductor used for a microminiature power converter of a fifth embodiment of the invention.

FIG. 9 shows an inductor used for a microminiature power converter of a fifth embodiment of the invention, and is a main part sectional view corresponding to FIG. 7(b). A difference from FIG. 7(b) is that the protection film 16 is not formed on the magnetic insulating substrate 1 at the side where the IC chip 11 is fixed and on the coil conductor 4, but only an under filling 18 is formed by a subsequent process. As is explaining in FIG. 12, in the case where the IC chip 11 is fixed, the effect is exhibited.

Figure 10:
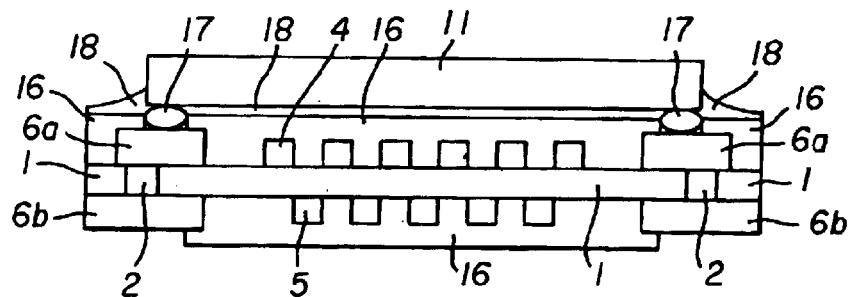
FIG. 10 illustrates a microminiature power converter of a sixth embodiment of the invention.

FIG. 10 shows a microminiature power converter of a sixth embodiment of the invention, and is a main part sectional view corresponding to FIG. 2. Here, the inductor of FIG. 7 is used. A difference from FIG. 2 is that the surface of the outer peripheral part of the magnetic insulating substrate 1 is directly covered with a protection film 16, and it is covered with an under filling 18. By so doing, the adhesion interface between the electrode 6a and the protection film 16 formed up to the outer peripheral end of the magnetic insulating substrate 1 as shown in FIG. 2 is eliminated.

In the case of the resist protection film in which resist is used for the protection film 16, the adhesion force in the case where the magnetic insulating substrate 1 is covered with the resist protection film becomes higher than that in the case where the electrode 6 is covered with the resist protection film. Thus, the adhesion interface having low adhesion force between the electrode and the resist protection film is not exposed at the outer peripheral part of the magnetic insulating substrate 1, the penetration of moisture from the interface is prevented, and the microminiature power converter excellent in moisture resistance and having high reliability can be fabricated.

Figure 11:
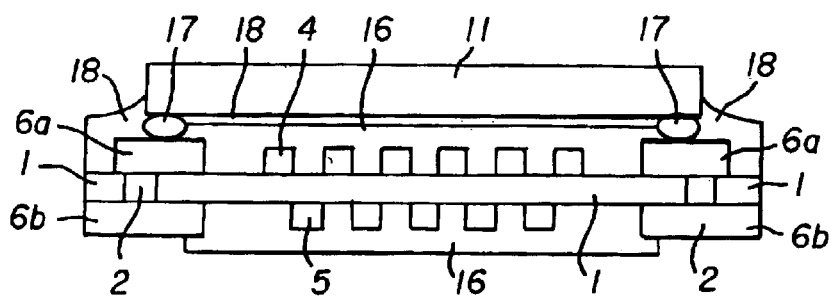
FIG. 11 illustrates a microminiature power converter of a seventh embodiment of the invention.

FIG. 11 shows a microminiature power converter of a seventh embodiment of the invention, and is a main part sectional view corresponding to FIG. 10. Here, the inductor of FIG. 8 is used. A difference from FIG. 10 is that the surface of the outer peripheral part of the magnetic insulating substrate 1 is directly covered with the under filling 18. Since the adhesion force at the interface between the magnetic insulating substrate 1 and the under filling 18 is higher than the adhesion force between the magnetic insulating substrate 1 and the resist protection film, the reliability can be made higher than the sixth embodiment.

Figure 12:
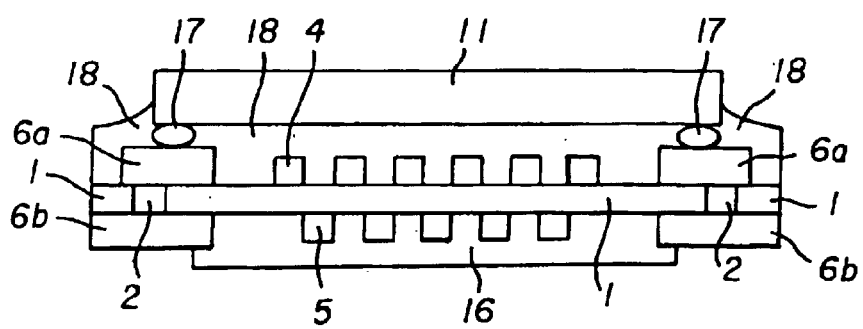
FIG. 12 illustrates a microminiature power converter of an eighth embodiment of the invention.
Figure 13:
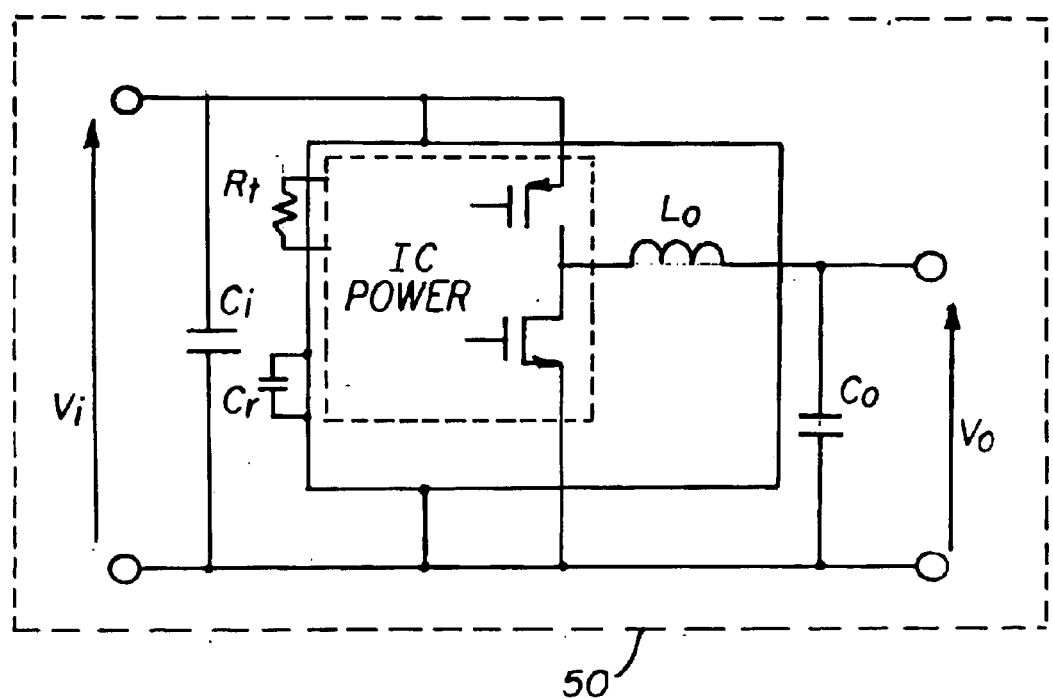
FIG. 13 illustrates a circuit structural view of a conventional DC-DC converter.

FIG. 12 shows a microminiature power converter of an eighth embodiment of the invention, and is a main part sectional view corresponding to FIG. 10. Here, the inductor of FIG. 9 is used. A difference from FIG. 10 is that the protection film 16 does not exist on the coil conductor 4 as well, and it is covered with the under filling 18. By this, in addition to the effect of the seventh embodiment, the adhesiveness between the IC chip 11 and the magnetic insulating substrate 1 is improved, and the reliability can be further raised.

According to the invention, the coil conductor of the inductor reduced in thickness is formed into the solenoid shape, and when the length of the coil conductor is made d, and the length of the magnetic insulating substrate is made L, d>L/2 is established, so that the inductance of the inductor reduced in thickness can be made high, and the DC superposition characteristic can be improved. Further, by covering the coil conductor with the resin in which the magnetic fine particles are dispersed, the higher inductance and the improvement in the DC superposition characteristic can be realized.

When the power IC chip and the capacitor (laminated ceramic capacitor array) are directly surface mounted on the inductor reduced in thickness, it is possible to fabricate the ultra-thin microminiature power converter including the inductor (thin film magnetic induction element) reduced in thickness, in which the mounting area is small, the power conversion efficiency is improved, and the power loss can be reduced.

Further, when the end of the electrode is formed inside the end of the magnetic insulating substrate, and the outer peripheral part of the magnetic insulating substrate is covered with the protection film or the under filling, it is possible to fabricate the microminiature power converter excellent in moisture resistance and having high reliability.

What is claimed is:

1. A microminiature power converter comprising:
   a semiconductor substrate on which a semiconductor integrated circuit is formed;
   a thin film magnetic induction element; and
   a capacitor,
   wherein the thin film magnetic induction element includes a magnetic insulating substrate, and a solenoid coil conductor in which a first conductor is formed on a first principal plane of the magnetic insulating substrate, a second conductor is formed on a second principal plane of the magnetic insulating substrate, and a connection conductor is formed in a through hole passing through the magnetic insulating substrate are connected; and
   wherein a relationship of a length L of the magnetic insulating substrate in a direction vertical to a magnetic field generated by the solenoid coil and a length d of the coil conductor is $d \geq L/2$.

2. A microminiature power converter according to claim 1, wherein the magnetic insulating substrate comprises a ferrite substrate.

3. A microminiature power converter according to claim 1, wherein a surface of the coil conductor is covered with at least one of an insulating film and a resin in which magnetic fine particles are dispersed.

4. A microminiature power converter according to claim 1, wherein the first principal plane and the second principal plane of the magnetic insulating substrate of the thin film magnetic induction element are provided with electrodes electrically connected through a through hole.

5. A microminiature power converter according to claim 4, wherein the semiconductor substrate is electrically connected to the electrodes formed on the magnetic insulating substrate of the thin film magnetic induction element.

6. A microminiature power converter according to claim 5, wherein the electrode electrically connected to the semiconductor substrate is disposed on an inside surface separate from an outer peripheral end of the magnetic insulating substrate.

7. A microminiature power converter according to claim 6, wherein the principal plane of the magnetic insulating substrate on which the electrode electrically connected to the semiconductor substrate is disposed is covered with a protection film which is in direct contact with a peripheral part surface of a whole outer periphery of the principal plane.

8. A microminiature power converter according to claim 7, wherein the protection film is a resist protection film.

9. A microminiature power converter according to claim 6, wherein a part of the semiconductor substrate and a peripheral part surface of a whole outer periphery of the principal plane of the magnetic insulating substrate on which the electrode electrically connected to the semiconductor substrate is disposed are covered with a direct contact binder.

10. A microminiature power converter according to claim 9, wherein the binder is an under filling.

11. A microminiature power converter according to claim 7, wherein a part of the semiconductor substrate and a peripheral part surface of a whole outer periphery of the principal plane of the magnetic insulating substrate on which the electrode electrically connected to the semiconductor substrate is disposed are covered with a direct contact binder.

12. A microminiature power converter according to claim 11, wherein the binder is an under filling.

13. A microminiature power converter according to claim 8, wherein a part of the semiconductor substrate and a peripheral part surface of a whole outer periphery of the principal plane of the magnetic insulating substrate on which the electrode electrically connected to the semiconductor substrate is disposed are covered with a direct contact binder.

14. A microminiature power converter according to claim 13, wherein the binder is an under filling.

* * * * *